(12) United States Patent
Hubbard

(10) Patent No.: US 6,246,332 B1
(45) Date of Patent: Jun. 12, 2001

(54) SYSTEM AND METHOD FOR DETECTING VOLTAGE AND CURRENT IMBALANCE IN AN ELECTRICAL ENERGY SUPPLY

(75) Inventor: Vick A. Hubbard, Wake Forest, NC (US)

(73) Assignee: ABB Power T&D Company Inc., Raleigh, NC (US)

( * ) Notice: Subject to any disclaimer, the term of this patent is extended or adjusted under 35 U.S.C. 154(b) by 0 days.

(21) Appl. No.: 09/555,553

(22) PCT Filed: Nov. 18, 1998

(86) PCT No.: PCT/US98/24780

§ 371 Date: Jun. 15, 2000

§ 102(e) Date: Jun. 15, 2000

(87) PCT Pub. No.: WO99/30300

PCT Pub. Date: Jun. 17, 1999

(51) Int. Cl.[7] .................................................. G08B 21/00
(52) U.S. Cl. ....................... 340/658; 340/635; 340/660; 340/661; 340/664; 340/364; 340/23; 340/24; 340/31; 340/47

(58) Field of Search ..................................... 340/658, 635, 340/660, 661, 664; 361/23, 24, 31, 33, 44, 47

(56) References Cited

U.S. PATENT DOCUMENTS 4,119,926 * 10/1978 Frosch et al. .......................... 307/232
4,319,298 * 3/1982 Davis et al ............................. 361/24

* cited by examiner

Primary Examiner—Julie Lieu
(74) Attorney, Agent, or Firm—Woodcock Washburn Kurtz Mackiewicz & Norris

(57) ABSTRACT

A system and method for detecting a current imbalance and a voltage imbalance in multiphase electrical energy provided to an energy meter. A phase single value is measured for each phase, a normalized phase value for each phase is determined, and a normalized phase value is compared to a first threshold, and the normalized phase value ratio is compared to a second threshold. It is determined that an imbalance exists when the high normalized phase value is greater than the first threshold and the normalized phase value ratio is less than the second threshold.

19 Claims, 2 Drawing Sheets

SYSTEM AND METHOD FOR DETECTING VOLTAGE AND CURRENT IMBALANCE IN AN ELECTRICAL ENERGY SUPPLY

This application is a national stage entry of PCT/US98/24780 which has internation filing date Nov. 18, 1998

FIELD OF THE INVENTION

The present invention relates in general to the field of electronic energy meters. More particularly, the present invention relates to electronic energy meters with systems for detecting voltage and current imbalances in the electrical energy supply that is provided to the energy meter.

BACKGROUND OF THE INVENTION

The recent deregulation of the utility industry has created a market for products that facilitate the efficient distribution and monitoring of electrical power. In the past, utilities have built systems that did not provide certain information that is considered necessary to adequately monitor the electrical energy that is provided to and from a substation, or multiple substations, and related feeder networks and the like. For example, existing metering systems have been used to monitor the phase voltage or phase current for each phase of a multiphase utility service system to determine whether it is within an absolute limit (i.e., between an upper and a lower threshold). Predetermined actions, such as activating an alarm or a warning, are taken when a threshold is crossed. However, such monitoring does not identify situations where the phase voltages or currents are within individual phase limits but are not proportional to each other. In other words, the phase voltages/currents are not checked relative to each other. Therefore, there can be some imbalance, although each phase is within its absolute limit.

Imbalance can exist, for example, when two phases are at the top of their current or voltage range, and one is at the bottom of its range. For example, phases A and B may be at 110% of their nominal values, and phase C may be at 90% of its nominal value. Each phase may be within individual phase limits, but the voltages/currents supplied by each phase are not equal (e.g., there may be a problem with phase C). Imbalance is not desirable, and in many applications, it is desirable to maintain closely balanced phase voltages and phase currents. Thus, in prior art systems, there is no indication of a phase voltage or phase current problem as long as each phase is within its predetermined limits, although imbalance may exist.

One reason to monitor voltage and/or current imbalance is economic, e.g., imbalance will affect equipment and processes and can result in misoperation and damage of equipment, disruption of operations, and other such anomalies. Moreover, imbalance is prohibited within some systems (e.g., imbalance determination is mandatory in some countries, such as India). Furthermore, a consumer, such as a business, may now be able to choose its utility provider, and therefore the customer may now have a need or desire to determine the quality of the power supplied by its present supplier. Similarly, the utilities have a need to monitor the power they supply to customers to ensure that they are providing power that is sufficiently balanced to retain their customers. Therefore, utilities and consumers are now in need of a metering system to detect voltage and current imbalance.

Although the art of metering systems is well developed, there remain some problems inherent in this technology, particularly the ability to detect voltage and current imbalance in multiphase service. Therefore, a need exists for a system and method for detecting imbalance that overcomes the drawbacks of the prior art.

SUMMARY OF THE INVENTION

The present invention is directed to a method for detecting a current imbalance and/or a voltage imbalance in multiphase electrical energy provided to an energy meter via a service type. The method comprises the steps of measuring a phase value for each phase of the electrical energy; determining a normalized phase value for each phase; determining a high normalized phase value responsive to the measured phase values; determining a normalized phase value ratio responsive to the normalized phase values; comparing the high normalized phase value to a first threshold; comparing the normalized phase value ratio to a second threshold; and determining that an imbalance exists when the high normalized phase value is greater than the first threshold and the normalized phase value ratio is less than the second threshold.

According to one aspect of the present invention, an imbalance indicator is activated responsive to the imbalance.

In accordance with an aspect of the present invention, the step of determining a normalized phase value for each phase comprises the steps of determining a nominal phase value for each phase, and dividing the measured phase value by the nominal value.

In accordance with a further aspect of the present invention, the step of determining the nominal phase value comprises the step of retrieving the nominal phase value for the service type from a memory.

In accordance with a further aspect of the present invention, the invention further comprises the step of determining a low normalized phase value responsive to the measured phase values, and the step of determining the normalized phase value ratio comprises the step of dividing the low normalized phase value by the high normalized phase value.

Another embodiment within the scope of this invention includes a system for detecting a current imbalance and/or a voltage imbalance in multiphase electrical energy provided to an energy meter via a service type. The system comprises means for measuring a phase value for each phase of the electrical energy; means for determining a normalized phase value for each phase; means for determining a high normalized phase value responsive to the measured phase values; means for determining a normalized phase value ratio responsive to the normalized phase values; means for comparing the high normalized phase value to a first threshold; means for comparing the normalized phase value ratio to a second threshold; and means for determining that an imbalance exists when the high normalized phase value is greater than the first threshold and the normalized phase value ratio is less than the second threshold.

According to another aspect of the present invention, means are provided for activating an imbalance indicator responsive to the imbalance. The imbalance indicator preferably comprises at least one of an LCD display, an event log, and a relay output that can be attached to an option connector.

According to another aspect of the present invention, a memory is provided for storing the nominal phase values for the service type, the first threshold, and the second threshold. The means for determining the nominal phase value comprises means for retrieving the nominal phase value for the service type from the memory.

According to other aspects of the present invention, the memory comprises a non-volatile memory, the means for determining a normalized phase value for each phase comprises an integrated circuit, and the means for determining that the imbalance exists comprises a microcontroller. The integrated circuit preferably comprises at least one analog/digital (A/D) converter and a programmable digital signal processor (DSP).

The foregoing and other aspects of the present invention will become apparent from the following detailed description of the invention when considered in conjunction with the accompanying drawings.

DESCRIPTION OF EXEMPLARY EMBODIMENTS AND BEST MODE

In accordance with the present invention, systems and methods for voltage and current imbalance of multiphase electrical energy will now be described with reference to the figures. It will be appreciated by those of ordinary skill in the art that the description given herein with respect to those figures is for exemplary purposes only and is not intended in any way to limit the scope of the invention. For example, during the description of the preferred embodiment of the detection method and system, an exemplary meter is used to illustrate the invention. However, such examples are merely for the purpose of clearly describing the methods and systems of the present invention and are not intended to limit the invention. Moreover, example applications are used throughout the description wherein the present invention is employed in conjunction with a particular electronic energy meter. That meter is not intended to limit the invention, as the invention is equally applicable to other metering systems.

Figure 1:
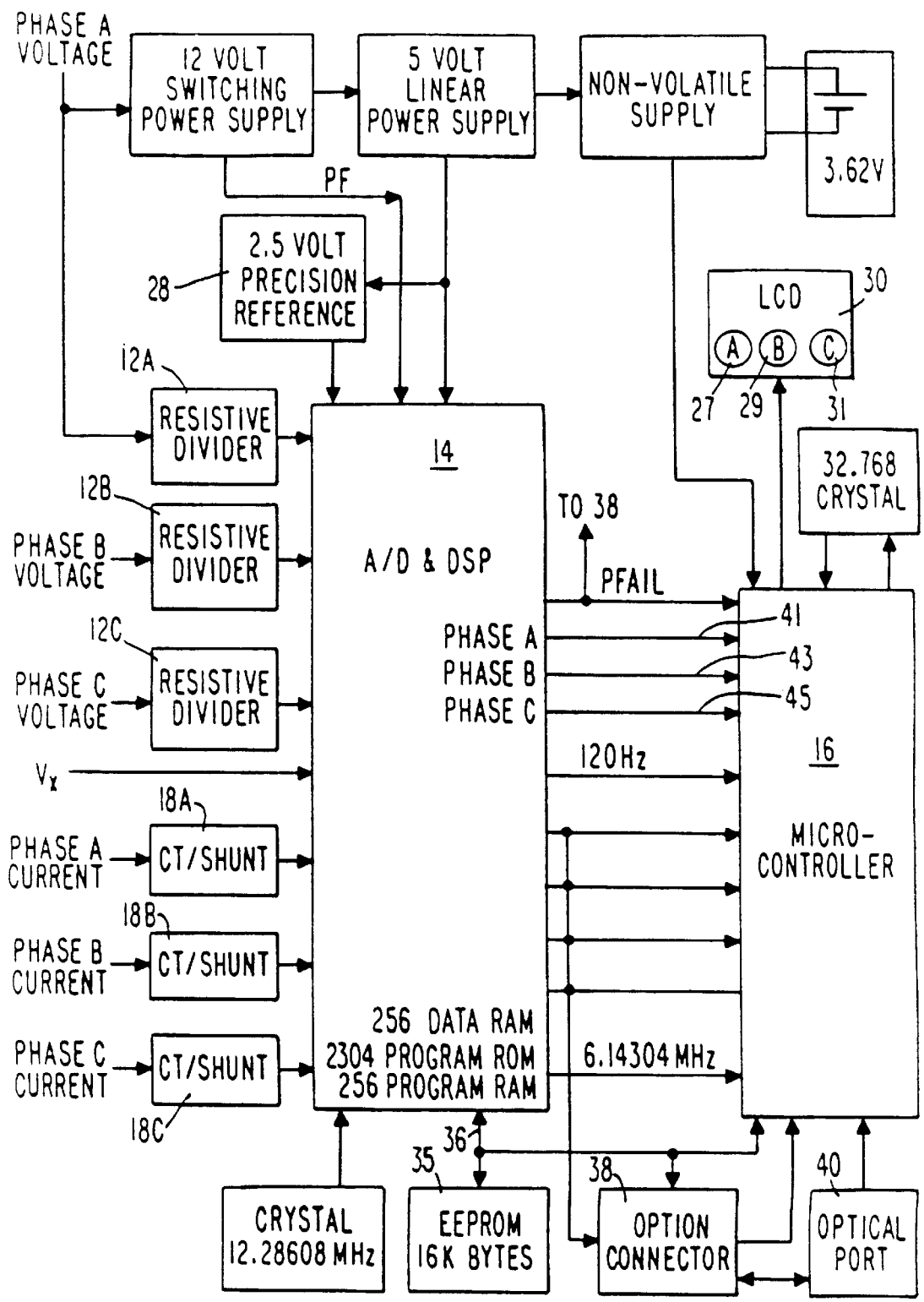
FIG. 1 is a block diagram showing the functional components of an exemplary meter and their interfaces in accordance with the present invention.

The present invention provides voltage and current imbalance detection features in connection with metering multiphase electrical energy. For multiphase service types, even though each phase voltage is within an absolute limit, the phase voltages for each phase may be imbalanced with respect to each other. FIG. 1 is a block diagram showing the functional components of an exemplary meter and their interfaces to which the present invention is applicable. The meter is described in the co-pending PCT application entitled "ENERGY METER WITH POWER QUALITY MONITORING AND DIAGNOSTIC SYSTEMS", No. PCT/US97/18547, having an international filing date of Oct. 16, 1997 which is incorporated herein by reference.

As shown in FIG. 1, a meter for metering three-phase electrical energy preferably includes a digital LCD type display 30, a meter integrated circuit (IC) 14 which preferably comprises A/D converters and a programmable DSP, and a microcontroller 16.

Analog voltage and current signals propagating over power transmission lines between the power generator of the electrical service provider and the users of the electrical energy are sensed by voltage dividers 12A, 12B, 12C and current transformers or shunts 18A, 18B, 18C, respectively. The outputs of the resistive dividers 12A–12C and current transformers 18A–18C, or sensed voltage and current signals, are provided as inputs to the meter IC 14. The A/D converters in the meter IC 14 convert the sensed voltage and current signals into digital representations of the analog voltage and current signals. In a preferred embodiment, the A/D conversion is carried out as described in U.S. Pat. No. 5,544,089, dated Aug. 6, 1996, and entitled "PROGRAMMABLE ELECTRICAL METER USING MULTIPLEXED ANALOG-TO-DIGITAL CONVERTERS", assigned to ABB Power T & D Company. The digital voltage and current representations are then input to the microcontroller 16 through an IIC bus 36. The voltage and current representations are processed by the microcontroller 16 to perform the imbalance measurements and to activate an indicator or alert upon detection of an imbalance.

The meter IC 14 and the microcontroller 16 each preferably interface with one or more memory devices through an IIC bus 36. A memory, preferably a non-volatile memory such as an EEPROM 35, is provided to store nominal phase voltage and current data and threshold data as well as programs and program data. Upon power up after installation, a power failure, or a data altering communication, for example, selected data stored in the EEPROM 35 may be downloaded to the program RAM and data RAM associated within the meter IC 14, as shown in FIG. 1. The DSP under the control of the microcontroller 16 processes the digital voltage and current signals in accordance with the downloaded programs and data stored in the respective program RAM and data RAM.

To perform imbalance measurements, the microcontroller 16 may use both voltage and current measurement information from the DSP. The meter IC 14 monitors the digital phase voltage signals and phase current signals over, for example, two line cycles and then computes the near-instantaneous RMS phase values for instrumentation purposes. It should be understood that the number of line cycles is preferably programmable and a different number of line cycles may be used for designated measurements. The phase values computed for each phase, A, B, and/or C, are then stored in registers in the data RAM. The microcontroller 16 polls for data in these registers via the IIC bus 36 for instrumentation processing.

The DSP in the meter IC 14 also drives potential indicators 27, 29, and 31 which are preferably designated sections on the display 30. These indicators may be used alone or in combination to indicate a voltage or current imbalance. Thresholds that are used in the imbalance determination are preferably downloaded from the EEPROM 35 to the data RAM in the IC 14. A comparator performs the desired comparisons and generates an output that is high whenever the measurement exceeds the programmable threshold. Phase A, B, and C potential signals are output from the meter IC 14 to the microcontroller 16, which in turn drives the potential indicators 27, 29, and 31 so that the potential indicator(s) remains lit when the corresponding potential signals are high.

Following power-up at installation, a service test can be performed to identify and/or check the electrical service. The meter may be preprogrammed for use with a designated service or it may determine the service using a service test. When the service test is used to identify the electrical service, an initial determination is made of the number of active elements. To this end, each element (i.e., 1, 2, or 3 elements) is checked for voltage. Once the number of elements is identified, many of the service types can be eliminated from the list of possible service types. The voltage phase angle relative to phase A may then be calculated and compared to each phase angle for abc or cba rotations with respect to the remaining possible services, e.g., within ±15°. If a valid service is found from the phase angle comparisons, the service voltage is preferably determined by comparing the RMS voltage measurements for each phase with nominal phase voltages for the identified service. If the nominal service voltages for the identified service matches measured values within an acceptable tolerance range, a valid service is identified and the phase rotation, service voltage, and service type are preferably displayed. The service may be locked, i.e., the service information is stored in a memory, preferably a non-volatile memory, such as the EEPROM 35, manually or automatically.

When the service type is known in advance and locked, the service test preferably checks to ensure that each element is receiving phase potential and that the phase angles are within a predetermined percentage of the nominal phase angles for the known service. The per-phase voltages are also measured and compared to the nominal service voltages to determine whether they are within a predefined tolerance range of the nominal phase voltages. If the voltages and phase angles are within the specified ranges, the phase rotation, the service voltage, and service type are displayed on the meter display. If either a valid service is not found or the service test for a designated service fails, a system error code indicating an invalid service is displayed and locked on the display to ensure that the failure is noted and evaluated to correct the error.

The meter of FIG. 1 also provides for remote meter reading, remote power quality monitoring, and reprogramming through an optical port 40 and/or an option connector 38. Although optical communications may be used in connection with the optical port 40, the option connector 38 may be adapted for RF communications or electronic communications via modem, for example.

When an imbalance is detected, a predefined code indicative of an abnormal condition is displayed or other warning or alert is activated. However, since the condition is not necessarily related to one specific error, it is considered a warning or a flag condition and activation of the alert preferably does not affect the operation of the meter. Whether or not particular abnormal conditions drive a warning or alert on the display may be selected through programmable options. Optionally, the imbalance indicator comprises a relay output that can be attached to an option connector, such as the option connector 38.

The warnings and alerts may be time and date stamped and logged in an event log and the number of events and cumulative time of the conditions may be separately logged in an occurrence log unique to each type of imbalance test; i.e., occurrence logs are optionally assigned to the imbalance tests. The logs are preferably stored in a memory, such as the EEPROM 35 shown in FIG. 1. The information stored in these logs may be accessed through software for further diagnostic processing and evaluation external to the meter itself.

The systems for performing imbalance tests according to the present invention are preferably implemented in firmware, wherein such operations are enabled by the correct programming of data tables. However, the system of the present invention can be implemented in general purpose computers using software, or exclusively in special purpose hardware, or in a combination of the two.

Figure 2:
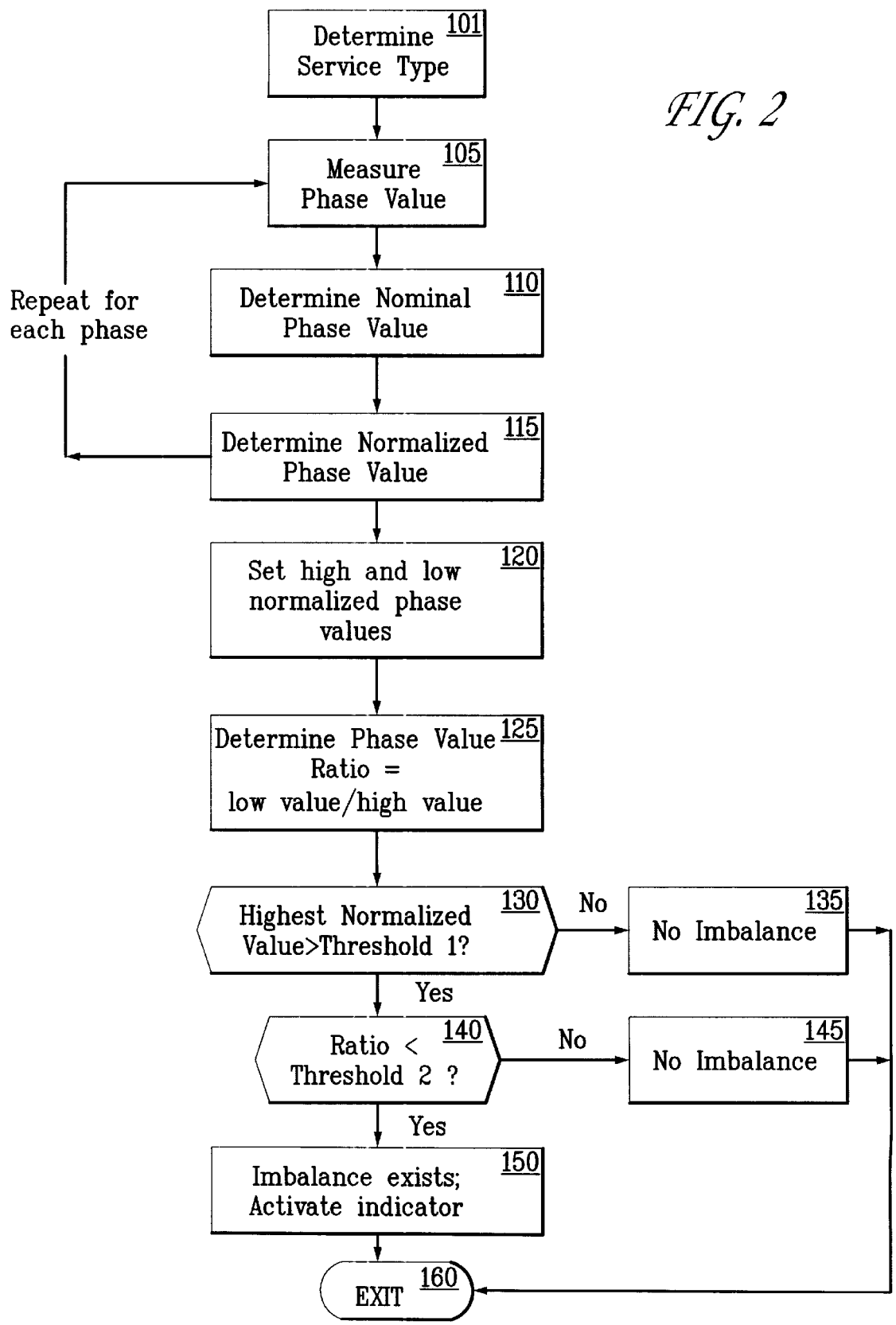
FIG. 2 is a flow chart of an exemplary process in accordance with the present invention.

FIG. 2 is a flow chart of an exemplary process of detecting imbalance in accordance with the present invention. At step 101, the service type is determined, in accordance with the description above for example, either automatically within the meter, or retrieved from a memory within the meter. A phase value, such as a phase voltage or phase current, for a particular phase is measured, at step 105. The nominal phase value is then determined at step 110. The nominal phase value for each phase of each service is preferably stored in a non-volatile memory in the meter, such as the EEPROM 35. It can also be computed from the nominal service value if the ratio of the phase value to the nominal service is known. A meter can store the ratios in memory, such as the EEPROM 35, and then use the ratios to generate each phase value.

At step 115, a normalized phase value is determined by dividing the measured value by the nominal value. Normalized phase values are used because in some service types, the individual nominal phase values are not equal to each other. For example, a 240 V delta system may have nominal phase voltages of 120 V, 120 V, and 208 V, respectively, for phases A, B, and C. A direct comparison of phase A to phase C would yield a difference so large that smaller deviations between phases A and B would appear insignificant. This problem is solved by dividing each measured phase value by its nominal phase value to produce a normalized phase value for each phase. After the phase voltages are normalized, meaningful comparisons between phases can be made.

Steps 105–115 are repeated for each phase. After the normalized phase value for each phase is determined, a high normalized phase value and a low normalized phase value are determined for the set of phases that have been measured, at step 120. A phase value ratio of the lowest normalized value to the highest normalized value is determined at step 125.

At step 130, the highest normalized phase value is compared to a first predetermined threshold. If the highest normalized phase value is not greater than the first threshold, then it is determined at step 135 that no imbalance exists, and the process exits at step 160. If the highest normalized phase value is greater than the first threshold, then the ratio determined at step 125 is compared to a second predetermined threshold, at step 140. If the ratio is not less than the second threshold, then it is determined at step 145 that no imbalance exists, and the process exits at step 160. If the ratio is less than the second threshold, then it is determined at step 150 that an imbalance exists, and an indicator, such as a message, is activated and displayed. The process then exits at step 160. It should be noted that the threshold numbers for comparison are dimensionless values that are applicable to all service types (e.g., threshold numbers range between 0 and 1 because the measurements are normalized for each service type), and are preferably stored in a memory within the meter, for example, the EEPROM 35.

Thus, an imbalance exists when the absolute value of the ratio of the lowest phase service phase value to the highest service phase value is less than a predetermined ratio threshold. Moreover, the highest service phase value is used as an imbalance qualifier. If the highest service phase value is greater than a predetermined threshold, the ratio is determined and checked. If an imbalance exists, an indicator is activated.

The process of FIG. 2 can be used to detect phase current imbalance and phase voltage imbalance. It should be noted that a phase current imbalance can exist without a phase voltage imbalance, and vice versa. The phase current imbalance and phase voltage imbalance tests check for different conditions and thus can be performed independently.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed is:

1. A method for detecting one of a current imbalance and a voltage imbalance in electrical energy having a plurality of phases provided to an energy meter via a service type, comprising the steps of:

measuring a phase value for each phase of said plurality of phases of said electrical energy;

determining a normalized phase value for each phase;

determining a high normalized phase value responsive to said measured phase values;

determining a normalized phase value ratio responsive to said normalized phase values;

comparing said high normalized phase value to a first threshold;

comparing said normalized phase value ratio to a second threshold; and determining that an imbalance exists when said high normalized phase value is greater than said first threshold and said normalized phase value ratio is less than said second threshold.

2. The method according to claim 1, further comprising the step of activating an imbalance indicator responsive to said imbalance.

3. The method according to claim 1, wherein the step of determining a normalized phase value for each phase comprises the steps of determining a nominal phase value for each phase, and dividing said measured phase value by said nominal value.

4. The method according to claim 3, wherein the step of determining said nominal phase value comprises the step of retrieving said nominal phase value for said service type from a memory.

5. The method according to claim 1, further comprising the step of determining a low normalized phase value responsive to said measured phase values, and wherein the step of determining said normalized phase value ratio comprises the step of dividing said low normalized phase value by said high normalized phase value.

6. The method according to claim 1, wherein said phase value is a phase voltage and said imbalance is a voltage imbalance.

7. The method according to claim 1, wherein said phase value is a phase current and said imbalance is a current imbalance.

8. A system for detecting one of a current imbalance and a voltage imbalance in electrical energy having a plurality of phases provided to an energy meter via a service type, comprising:

means for measuring a phase value for each phase of said plurality of phases of said electrical energy;

means for determining a normalized phase value for each phase;

means for determining a high normalized phase value responsive to said measured phase values;

means for determining a normalized phase value ratio responsive to said normalized phase values;

means for comparing said high normalized phase value to a first threshold;

means for comparing said normalized phase value ratio to a second threshold; and means for determining that an imbalance exists when said high normalized phase value is greater than said first threshold and said normalized phase value ratio is less than said second threshold.

9. The system according to claim 8, further comprising means for activating an imbalance indicator responsive to said imbalance.

10. The system according to claim 8, wherein said imbalance indicator comprises at least one of an LCD display, a relay, and an event log.

11. The system according to claim 8, wherein said means for determining a normalized phase value for each phase comprises means for determining a nominal phase value for each phase, and means for dividing said measured phase value by said nominal value.

12. The system according to claim 11, further comprising a memory for storing said nominal phase values for said service type, said first threshold, and said second threshold, wherein said means for determining said nominal phase value comprises means for retrieving said nominal phase value for said service type from said memory.

13. The system according to claim 12, wherein said memory comprises a non-volatile memory.

14. The system according to claim 8, further comprising means for determining a low normalized phase value responsive to said measured phase values, and wherein said means for determining said normalized phase value ratio comprises means for dividing said low normalized phase value by said high normalized phase value.

15. The system according to claim 8, wherein said means for determining a normalized phase value for each phase comprises an integrated circuit.

16. The system according to claim 15, wherein said integrated circuit comprises at least one analog/digital (A/D) converter and a programmable digital signal processor (DSP).

17. The system according to claim 8, wherein said means for determining that said imbalance exists comprises a microcontroller.

18. The system according to claim 8, wherein said phase value is a phase voltage and said imbalance is a voltage imbalance.

19. The system according to claim 8, wherein said phase value is a phase current and said imbalance is a current imbalance.

* * * * *